United States Patent [19]
Nomoto

[11] Patent Number: 5,440,148
[45] Date of Patent: Aug. 8, 1995

[54] QUANTUM OPERATIONAL DEVICE

[75] Inventor: Kazumasa Nomoto, Tokyo, Japan

[73] Assignee: Sony Corporation, Tokyo, Japan

[21] Appl. No.: 229,303

[22] Filed: Apr. 18, 1994

[30] Foreign Application Priority Data

Apr. 16, 1993 [JP] Japan .................. 5-114141

[51] Int. Cl.$^6$ .................. H01L 29/205; H01L 29/88
[52] U.S. Cl. ........................ 257/21; 257/17;
257/22; 257/25; 365/114; 365/115; 365/175;
365/215; 250/370.14
[58] Field of Search ............... 257/21, 22, 17, 25;
365/114, 115, 125, 215; 250/370.14

[56]      References Cited
       U.S. PATENT DOCUMENTS 5,291,034  3/1994  Allam et al. ................ 257/21

FOREIGN PATENT DOCUMENTS 0170044  2/1986  Japan ................ 257/25
2226916  7/1990  United Kingdom ........ 257/25

OTHER PUBLICATIONS

Longenbach et al, "Resonant . . . Heterostructures" *Appl. Phys Lettr* 57(15), 8 Oct. 90 pp. 1554–1556.

*Primary Examiner*—Jerome Jackson
*Attorney, Agent, or Firm*—Hill, Steadman & Simpson

[57]            ABSTRACT

A quantum operational device includes a plurality of quantum boxes arranged in a plurality of stages isolated by a distance which permits tunnelling of electrons or holes through the distance, uses as bit information the presence or absence of an electron or a hole in each of the quantum boxes, and prohibits tunnelling of an electron or a hole from a quantum box in a stage to another quantum box in an adjacent stage when an electron or a hole exists in the quantum box in the adjacent stage. The device only needs quite low power, performs operation at a high speed, and can be fabricated by a simple manufacturing process.

22 Claims, 8 Drawing Sheets

FIG. 14B $\{B_1\} = \{A_1\}$ AND $\{A_2\}$

QUANTUM OPERATIONAL DEVICE

RELATED APPLICATION

The present application is related to copending application, Ser. No. 172,734, titled "COLLECTIVE ELEMENT OF QUANTUM BOXES", filed Dec. 27, 1993, inventor Ryuichi Ugayin.

BACKGROUND OF THE INVENTION

This invention relates to a quantum operational device and, more particularly, to a quantum operational device using quantum boxes (also called quantum dots).

In recent high-integrated semiconductor memories, electrons on the order of $10^4$ stored in a capacitor in a memory cell represent one bit. When an operation between bits in such semiconductor memories is executed, electrons on the order of $10^4$ stored in a capacitor in a certain memory cell must be transferred to a capacitor of another memory cell.

Such transfer of electrons on the order of $10^4$ from a capacitor in a certain memory cell to a capacitor of another memory cell, however, requires an energy as much as several eV per one electron, so that a total energy of at least $10^4$ eV in total is consumed to execute an operation of one bit. That is, existing semiconductor memories inevitably cause high power consumption.

In particular for pattern processing, for example, operations are executed among a great number of bits, so that the power consumption is very high. Additionally, existing inter-pattern operations need access, one after another, to individual memory cells on a semiconductor memory, and hence requires a complicated circuit in which a great number of transistors are connected by wiring, which necessarily causes a slow processing speed. Further, such a complicated circuit inevitably greatly complicates its manufacturing process.

OBJECTS AND SUMMARY OF THE INVENTION

It is therefore an object of the invention to provide a quantum operational device significantly low in power consumption.

Another object of the invention is to provide a quantum operational device having a simple structure and hence a simplified its manufacturing process.

Still another object of the invention is to provide a quantum operational device capable of executing operations at a very high speed.

According to a first aspect of the invention, there is provided a quantum operational device comprising:

a plurality of quantum boxes arranged in a plurality of different stages isolated by a distance which permits tunnelling of electrons or holes therethrough, the presence or absence of an electron or a hole in respective quantum boxes being used as bit information, and tunnelling of an electron or a hole from a first quantum box to a second quantum box being prohibited when an electron or a hole exists in the second quantum box, the first quantum box being one of the quantum boxes in one of the stages, and the second quantum box being one of the quantum boxes in another of the stages adjacent to the one of the stages.

According to a second aspect of the invention, there is provided a quantum operational device comprising:

a plurality of quantum boxes arranged in a plurality of different stages isolated by a distance which permits tunnelling of electrons or holes therethrough and arranged in two-dimensional arrays, the presence or absence of an electron or a hole in respective quantum boxes being used as bit information, and tunnelling of electrons or holes from first quantum boxes to second quantum boxes being prohibited when electrons or holes exist in the second quantum boxes, the first quantum boxes being those of the quantum boxes in one of the stages, and the second quantum boxes being those of the quantum boxes in another of the stages adjacent to the one of the stages.

According to a third aspect of the invention, there is provided a quantum operational device based on the first aspect of the invention, in which the quantum boxes include a highest-stage quantum box located in a highest one of the stages and a lowest-stage quantum box located in a lowest one of the stages, in which an electron is input to the highest-stage quantum box by irradiating light having a wavelength resonant with electron-hole pair generation energy of the highest-stage quantum box to the highest-stage quantum box and thereby generating an electron-hole pair while applying a bias voltage such that potential increases from the highest-stage quantum box toward the lowest-stage quantum box, in which in a first output mode, absorption of light is measured by irradiating light having a wavelength resonant with a difference in energy between subbands of respective quantum boxes in respective stages to the quantum box, and in which in a second output mode, emission of light generated by recombining an electron in respective quantum boxes in respective stages with a hole is measured.

According to a fourth aspect of the invention, there is provided a quantum operational device based on the third aspect of the invention, in which erasing is effected by substantially removing the bias voltage or by applying a bias voltage opposite in polarity from the bias voltage and thereby recombining an electron in respective quantum boxes in respective stages with a hole.

According to a fifth aspect of the invention, there is provided a quantum operational device based on the first aspect of the invention, in which respective quantum boxes is made of a type-II heterojunction superlattice.

According to the first or second aspect of the invention, the quantum operational device can perform an AND operation, an OR operation, an operation combining an AND operation and an OR operation, a NAND operation, a NOR operation, and an operation combining a NAND operation and a NOR operation between bits by inputting electrons or holes in the highest-stage quantum box by irradiation of light or the like and by utilizing tunnelling of electrons and holes between quantum boxes in adjacent ones of the stages. Since energy consumed for performing operation of one bit is quite small, the quantum operational device consumes only a very small amount of power. Further, since the quantum operational device has a simple structure, it may be fabricated by a simple manufacturing process.

According to the second aspect of the invention, because the quantum boxes in a plurality of stages are also arranged in two-dimensional arrays, operation among all bits can be done by a parallel, concurrent process. As a result, the quantum operational device can perform operations at a very high speed, and can perform, for example, pattern processing at a very high speed.

According to the third aspect of the invention, the quantum operational device can effect an input by irradiation of light and an output by absorption of light or emission of light.

According to the fourth aspect of the invention, the quantum operational device can readily clear information by substantially removing a bias voltage or by applying an opposite-polarity bias voltage.

According to the fifth aspect of the invention, because the quantum boxes are made as a type-II heterojunction superlattice such as an AlGaSb/InAs heterojunction readily fabricated by hetero-epitaxial growth, the quantum operational device can be fabricated easily.

The above, and other, objects, features and advantages of the present invention will become readily apparent from the following detailed description thereof which is to be read in connection with the accompanying

DETAILED DESCRIPTION OF THE PREFERRED EMBODIMENTS

Embodiments of the invention are explained below with reference to the drawings. In all of the drawings, the same or equivalent elements are labelled with common reference numerals. In all embodiments described below, quantum boxes are referred to as quantum dots.

First, a quantum operational device according to a first embodiment of the invention is described below.

Figure 1:
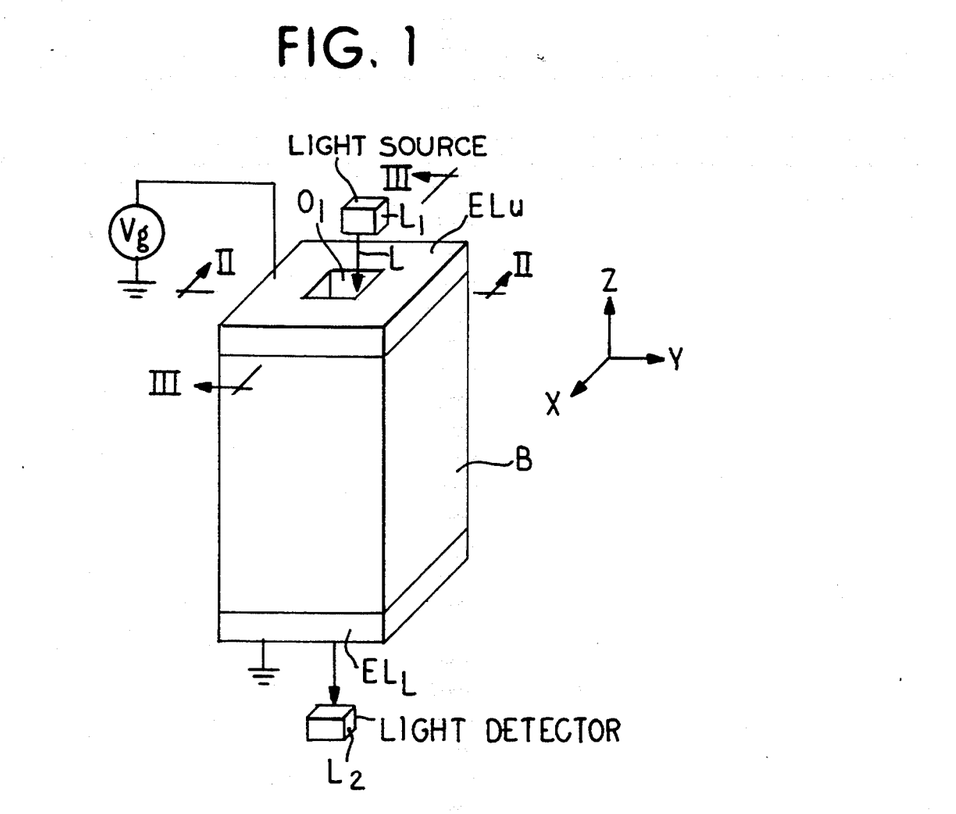
FIG. 1 is a perspective view of a quantum operational device according to a first embodiment of the invention.
Figure 2:
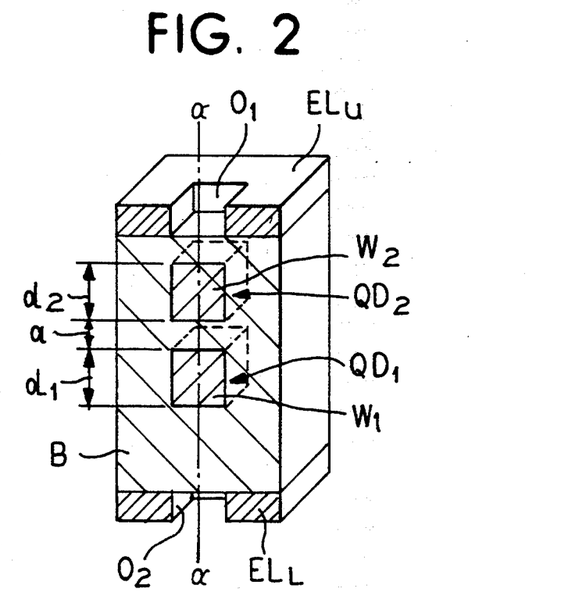
FIG. 2 is a cross-sectional view taken along the II—II line of FIG. 1.

FIG. 1 is a perspective view of a quantum operational device according to a first embodiment of the invention, and FIG. 2 is a cross-sectional view taken along the II—II line of FIG. 1. A cross-sectional view taken along the III—III line of FIG. 1 will appear the same as FIG. 2.

In FIGS. 1 and 2, $W_1$ and $W_2$ denote box-shaped well layers made of a first material and a second material, respectively. B denotes a barrier layer made of a third material. In this arrangement, the well layers $W_1$ and $W_2$ lie in a common axis extending in the Z direction. The first and second materials may be, for example, InAs, and the third material may be, for example, AlGaSb. The first and second materials may be different from each other.

The structure made of the well layer $W_1$ surrounded by the barrier layer B forms a quantum dot $QD_1$ in a first stage shown as the lower stage in FIG. 2, and the structure made of the well layer $W_2$ surrounded by the barrier layer B forms a quantum dot $QD_2$ in a second stage shown as the upper stage in FIG. 1. When using InAs as the first and second materials and AlGaSb as the third material as mentioned above, then the AlGaSb/InAs heterojunction making the quantum dots $QD_1$ and $QD_2$ is a so-called type-II heterojunction superlattice.

Provided on the upper and lower surfaces of the barrier layer B are an upper electrode $EL_U$ and a lower electrode $EL_L$ both made of metal. The upper electrode $EL_U$ and the lower electrode $EL_L$ have openings $O_1$ and $O_2$ at portions corresponding to the quantum dots $QD_1$ and $QD_2$, respectively. These openings $O_1$ and $O_2$ are used to introduce and release light therethrough.

Figure 3:
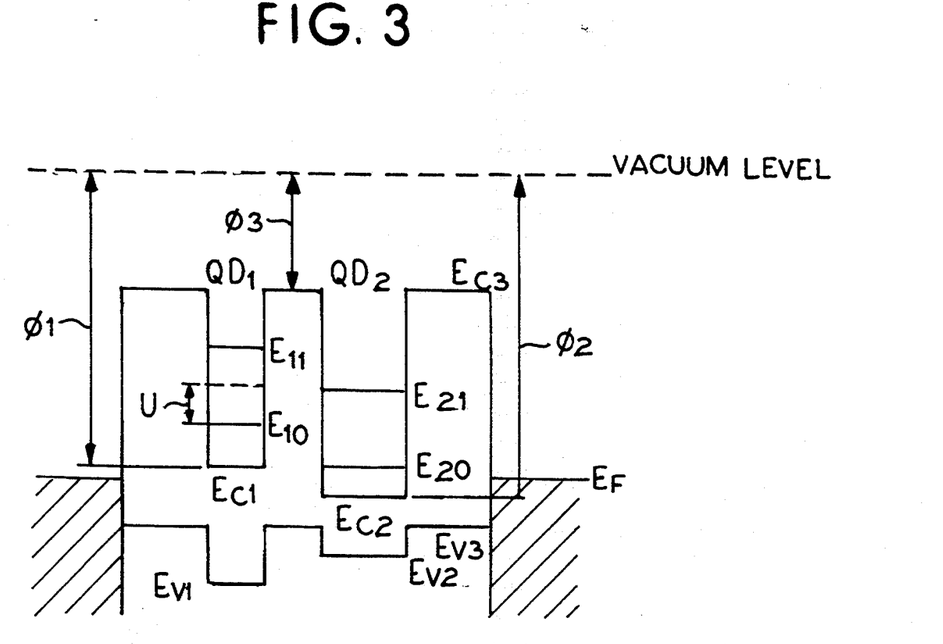
FIG. 3 is an energy band diagram taken along the α—α line of FIG. 2.

FIG. 3 shows an energy band diagram taken along the α—α line of FIG. 2. In FIG. 3, $E_{C1}$ and $E_{V1}$ represent energy at the lower end of the conduction band and energy at the upper end of the valence band of the first material. $E_{C2}$ and $E_{V2}$ represent energy at the lower end of the conduction band and energy at the upper end of the valence band of the second material. $E_{C3}$ and $E_{V3}$ represent energy at the lower end of the conduction band and energy at the upper end of the valence band of the third material. $E_F$ represents the Fermi energy. $\phi_1$, $\phi_2$ and $\phi_3$ represent electron affinities of the first, second and third materials, respectively, and they satisfy the following relation:

$$\phi_1, \phi_2 > \phi_3 \qquad (1)$$

When InAs is used as the first and second materials, and AlGaSb as the third material, then the equation (1) is satisfied. In this case, $\phi_1 = \phi_2$.

$E_{10}$ and $E_{11}$ are the energy level of the ground state and the energy level of the first excited state for the one-electron state in the quantum dot $QD_1$ having the well layer $W_1$ made of the first material, respectively. Similarly, $E_{20}$ and $E_{21}$ are the energy level of the ground state and the energy level of the first excited state for the one-electron state in the quantum dot $QD_2$ having the well layer $W_2$ made of the second material. U denotes an increase in energy in the one-electron state due to inter-electron Coulombic interaction in the quantum dot $QD_1$ which occurs when two electrons enter in the quantum dot $QD_1$.

As will be described later, in order to selectively introduce an electron in the quantum dot $QD_1$ or $QD_2$ by optical excitation, the following equation must be satisfied.

$$E_{10} - E_{V1} > E_{20} - E_{V2} \quad (2)$$

When the quantum operational device according to the first embodiment is activated at temperature T, in order to prevent any electron in the ground state in the quantum dot $QD_1$ or $QD_2$ from being excited to an excited state by phonons, for example, dimensions of the quantum dots $QD_1$ and $QD_2$ are chosen such that $E_{10}$, $E_{11}$, $E_{20}$, $E_{21}$ and U satisfy all of the following conditions.

$$E_{11} - E_{10} > k_B T \quad (3)$$

$$E_{21} - E_{20} > k_B T \quad (4)$$

$$U > k_B T \quad (5)$$

where $k_B$ is the Boltzmann's constant $(1.38066 \times 10^{-23} [J/K])$.

For example, if the quantum dot $QD_1$ is a cube whose side is $d_1$ long, and the quantum dot $QD_2$ is a cube whose side is $d_2$ long, then $d_1$ and $d_2$ must satisfy the following three conditions.

$$d_2 < \{3(h)^2/8m_0 m_{eff} k_B T\}^{\frac{1}{2}} \quad (6)$$

$$d_1 < \min[\{3(h)^2/8m_0 m_{eff} k_B T\}^{\frac{1}{2}}, e^2/4\pi\epsilon_0\epsilon k_B T] \quad (7)$$

where h is the Planck's constant $(6.62617 \times 10^{-34} [J\ s])$, $m_0$ is the rest mass of an electron $(9.1095 \times 10^{-31} [kg])$, $m_{eff}$ is the effective mass of an electron in the quantum dot $QD_1$ or $QD_2$, $\epsilon_0$ is the permittivity of vacuum $(8.85418 \times 10^{-14} [F/cm])$, $\epsilon$ is the specific dielectric constant of the quantum dot $QD_1$ or $QD_2$, and e is the unit electric charge $(1.60218 \times 10^{-19} [C])$. Equation (6) is a condition for establishing Eq. (4), and Eq. (7) is a condition for establishing both Eq. (3) and Eq. (5).

By entering numerical values for h, $m_0$, $k_B$, e, $\epsilon_0$, etc. in Eq. (6) and Eq. (7), they are rewritten as follows.

$$d_2 < 1.14 \times 10^{-7} [K^{\frac{1}{2}}]/(m_{eff} T[K])^{\frac{1}{2}} [m] \quad (8)$$

$$d_1 < \min[1.14 \times 10^7 [K^{\frac{1}{2}}]/(m_{eff} T[K])^{\frac{1}{2}}, 1.67 \times 10^{-5}/\epsilon T[K]] [m] \quad (9)$$

If InAs ($m_{eff} = 0.023 m_0$, $\epsilon = 14.6$) is used as both the first and second materials, then Eq. (8) and Eq. (9) are rewritten as follows:

$$d_2 < 7.54 \times 10^{-7} [K^{\frac{1}{2}}]/(T[K])^{\frac{1}{2}} [m] \quad (10)$$

$$d_1 < \min[7.54 \times 10^{-7} [K^{\frac{1}{2}}]/(T[K])^{\frac{1}{2}}, 1.14 \times 10^{-6} [K]/T[K]] [m] \quad (11)$$

Therefore, the quantum operational device according to the first embodiment can be activated at room temperature (T=300[K]) by choosing the lengths of respective sides $d_1$ and $d_2$ of the quantum dots $QD_1$ and $QD_2$ as follows.

$$d_2 < 7.54 \times 10^{-7}/300 \ [m] \quad (12)$$
$$= 43.5 \ [nm]$$

$$d_1 < \min[7.54 \times 10^{-7}/300, 1.14 \times 10^{-6}/300][m] \quad (13)$$
$$= 3.8 \ [nm]$$

Similarly, the same quantum operational device can be activated at liquid nitrogen temperature (T=77[K]) by choosing $d_1$ and $d_2$ as follows.

$$d_2 < 85.9 \ [nm]$$

$$d_1 < 14.8 \ [nm]$$

It can be activated at liquid helium temperature (T=4.2[K]) by choosing them as:

$$d_2 < 367 \ [nm]$$

$$d_1 < 270 \ [nm]$$

On the other hand, a distance a between the quantum dots $QD_1$ and $QD_2$ is chosen to permit tunnelling of an electron between the quantum dots $QD_1$ and $QD_2$. A specific example of the distance may be several nanometers.

Principle of operation of the quantum operational device according to the first embodiment having the above-described arrangement is explained below.

Input to the quantum operational device according to the first embodiment is conducted as follows. Assume here that the lower electrode $EL_L$ is connected to ground, and a bias voltage $V_g$ is applied to the upper electrode $EL_U$.

First, a negative bias voltage $V_g$ is applied to the upper electrode $EL_U$ to establish the condition:

$$E_{10} < E_{20} < E_{10} + U \quad (14)$$

Figure 4:
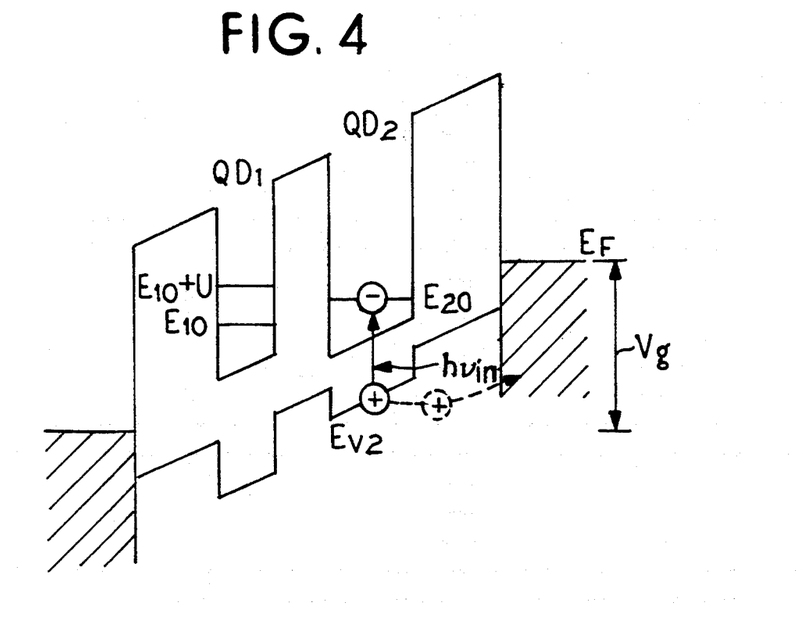
FIG. 4 is an energy band diagram for explaining a way of input of the quantum operational device according to the first embodiment of the invention.

FIG. 4 shows an energy band diagram taken along the $\alpha - \alpha$ line in FIG. 2 in this state. In this state, monochromatic light L having a frequency $\nu_{in}$ satisfying:

$$\nu_{in} = (E_{20} - E_{V2})/h \quad (20)$$

is irradiated to, for example, the portion of the opening $O_1$ of the upper electrode $EL_U$ from a light source $L_1$. Then an electron-hole pair is selectively generated only in the quantum dot $QD_2$. The hole of the electron-hole pair is absorbed by the upper electrode $EL_U$ (see FIG. 4). As a result, the electron of the electron-hole pair is left alone in the quantum dot $QD_2$, and hence can be input to the quantum dot $QD_2$.

Figure 5:
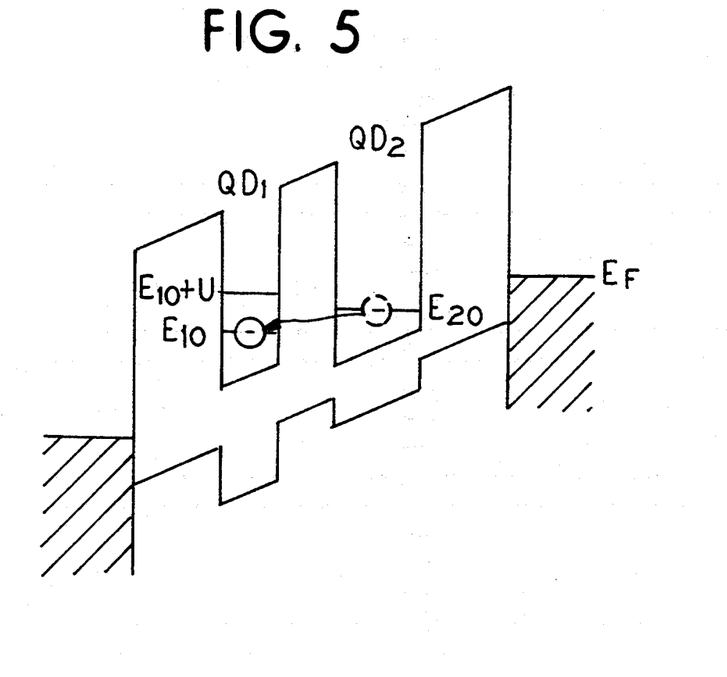
FIG. 5 is an energy band diagram for explaining an input method of the quantum operational device according to the first embodiment of the invention.

At the same time, as shown in FIG. 5, the electron in the quantum dot $QD_2$ propagates through the barrier layer B between the quantum dots $QD_2$ and $QD_1$ by tunneling, generates phonons or photons, and enter in the ground state energy level $E_{10}$ of the quantum dot $QD_1$ having lower energy. As a result, the electron is input in the quantum dot $QD_1$. This state with an electron having been input in the quantum dot $QD_1$ is taken as first bit information $A_1$.

Next, still in this state, the monochromatic light L having the frequency $\nu_{in}$ is again irradiated to the portion of the opening $O_1$ of the upper electrode $EL_U$. Then an electron is input to the ground state energy level $E_{20}$ in the quantum dot $QD_2$ in the same manner. This state with an electron having been input in the quantum dot $QD_2$ is taken as second bit information $A_2$.

The quantum operational device according to the first embodiment performs operations as next explained.

If an electron has been input in the quantum dot $QD_1$ as first bit information $A_1$, then an electron subsequently entering in the quantum dot $QD_1$ must have energy $E_{10}+U$. As shown by Eq. (14), here is established the condition $E_{20}<E_{10}+U$. Therefore, tunneling of the electron from the quantum dot $QD_2$ to the quantum dot $QD_1$ is not possible, and the electron remains in the quantum dot $QD_2$ (see FIG. 6).

Figure 6:
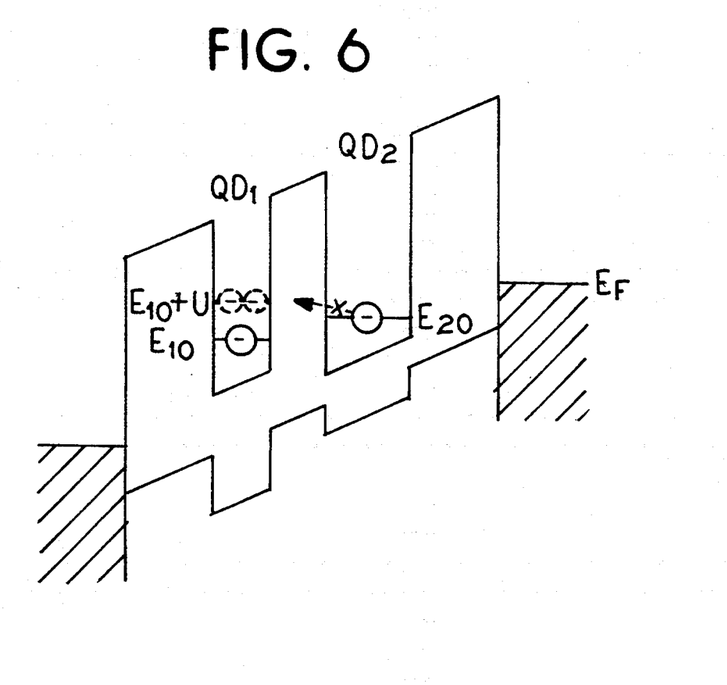
FIG. 6 is an energy band diagram for explaining a method of operation of the quantum operational device according to the first embodiment of the invention.

If no electron has been input in the quantum dot $QD_1$ as first bit information A1, an electron having been input to the quantum dot $QD_2$ as second bit information $A_2$ enters in the quantum dot $QD_1$ by tunneling.

As explained above, tunnelling of electrons between the quantum dots $QD_1$ and $QD_2$ can be controlled by inter-electron Coulombic interaction in the quantum dots $QD_1$ and $QD_2$.

That is, in the quantum operational device according to the first embodiment, whether an electron is at a first time input (=1) or not (=0) is used as bit information A1, and whether an electron is at a second time input (=1) or not (=0) is used as bit information $A_2$. Additionally, whether an electron exists (=1) or not (=0) in the quantum dot $QD_1$ in the final state after input of the bit information $A_2$ is used as bit information $B_1$, and whether an electron exists (=1) or not (=0) in the quantum dot $QD_2$ in the final state after input of the bit information $A_2$ is used as bit information $B_2$. These pieces of information appear as shown in Table 1.

TABLE 1

| $A_1$ | $A_2$ | $B_1$ | $B_2$ |
|---|---|---|---|
| 0 | 0 | 0 | 0 |
| 0 | 1 | 1 | 0 |
| 1 | 0 | 1 | 0 |
| 1 | 1 | 1 | 1 |

It can be understood from Table 1 (truth table) that the following operations are executed.

$B_1 = A_1$ OR $A_2$ $B_2 = A_1$ AND $A_2$

That is, by controlling electron tunnelling between the quantum dots $QD_1$ and $QD_2$ by inter-electron Coulombic interaction, AND operation and OR operation can be done.

In contrast, if the bit information $B_1$ indicates the presence (=0) or absence (=1) of an electron in the quantum dot QD1, and the bit information $B_2$ indicates the presence (=0) or absence (=1) of an electron in the quantum dot $QD_2$, then the following operations are executed.

$B_1 = A_1$ NOR $A_2$ $B_2 = A_1$ NAND $A_2$

That is, in this case, NAND operation and NOR operation can be done.

As referred to above, by changing the definition (0, 1) of the bit information $B_1$ and $B_2$, the following or other exchange is possible as desired.

AND ⇔ NAND, OR ⇔ NOR

Output from the quantum operational device according to the first embodiment of the invention is conducted as explained below.

Figure 7:
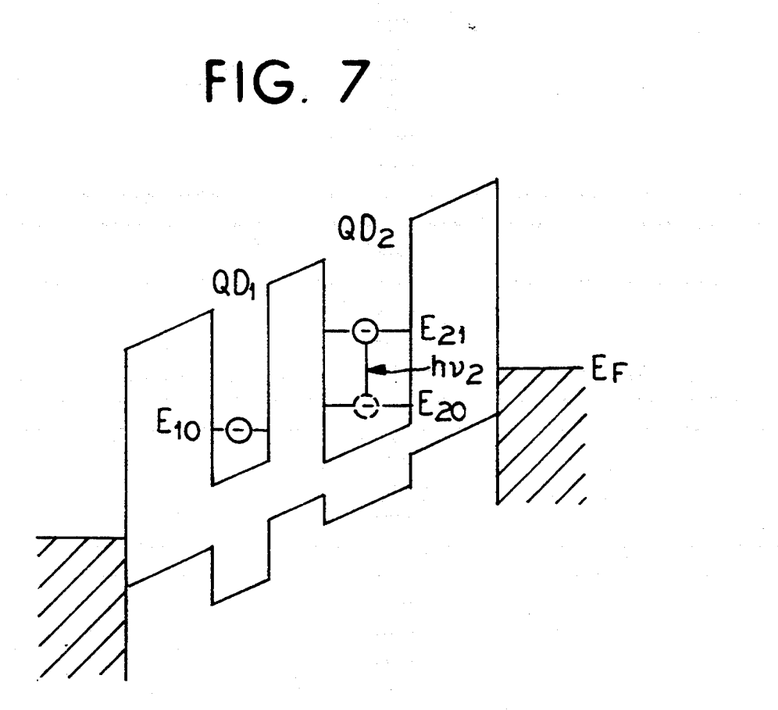
FIG. 7 is an energy band diagram for explaining output method of the quantum operational device according to the first embodiment of the invention.

During output, like during input, application of the bias voltage $V_g$ to the upper electrode $EL_U$ is maintained to satisfy Eq. (14). In this state, monochromatic light L with a frequency $\nu_2 = (E_{21}-E_{20})/h$ is irradiated as shown in FIG. 7. Then, when an electron exists in the ground state energy level $E_{20}$ in the quantum dot $QD_2$, a photon $h\nu_2$ is absorbed by resonance with an energy difference between subbands in the quantum dot $QD_2$, and the electron is excited to the excited state energy level $E_{21}$. When no electron exists in the ground state energy level $E_{20}$ in the quantum dot $QD_2$, absorption of the photon $h\nu_2$ does not occur. At that time, according to Eq. (2), there is no affect on the electron in the quantum dot $QD_1$.

As a result, by measuring absorption of the monochromatic light with a frequency $\nu_2 = (E_{21}-E_{20})/h$, bit information in the quantum dot $QD_2$ can be read out. Similarly, by measuring absorption of monochromatic light with a frequency $\nu_1 = (E_{11}-E_{10})/h$, bit information in the quantum dot $QD_1$ can be read out.

Since such a measurement does not destroy bit information either in the quantum dot $QD_1$ or in the quantum dot $QD_2$, the measurement may be repeated many times.

Erasing or clearing of the quantum operational device according to the first embodiment is effected as explained below.

Figure 8:
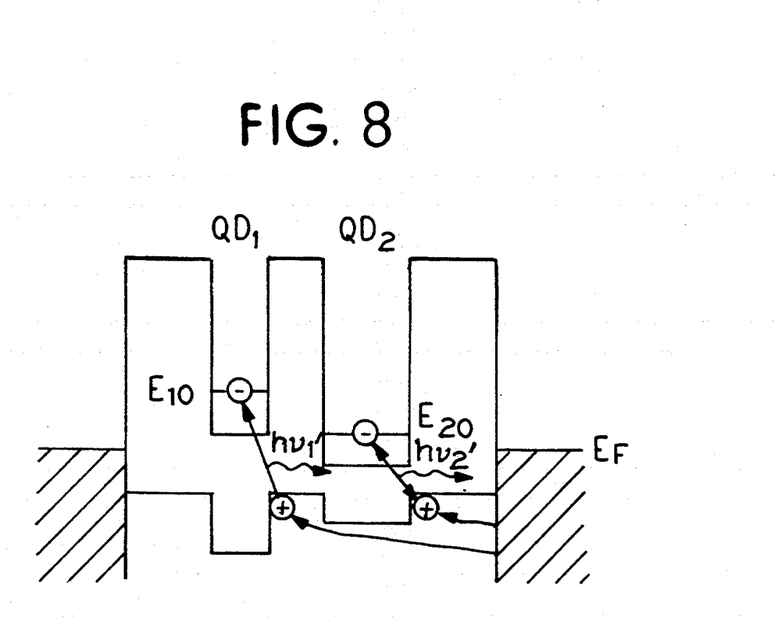
FIG. 8 is an energy band diagram for explaining an erasing method of the quantum operational device according to the first embodiment of the invention.

Bit information in the quantum dot $QD_1$ or $QD_2$ can be cleared by choosing the bias voltage $V_g=0$ to be applied to the upper electrode $EL_U$. FIG. 8 shows an energy band diagram in this state taken along the α—α line of FIG. 2. When the bias voltage $V_g=0$ has been chosen, holes are injected from the upper electrode $EL_U$ to the barrier layer B, and the holes recombine with electrons in the quantum dots $QD_1$ and $QD_2$ and photons $h\nu'_1$ and $h\nu'_2$ are emitted. As a result, electrons in the quantum dots $QD_1$ and $QD_2$ are cleared.

Such emission (=1) or non-emission (=0) of photons $h\lambda'_1$ and $h\nu'_2$ is used as bit information C. It appears as shown in Table 2.

TABLE 2

| $A_1$ | $A_2$ | C |
|---|---|---|
| 0 | 0 | 0 |
| 0 | 1 | 1 |
| 1 | 0 | 1 |
| 1 | 1 | 1 |

It is known from Table 2 (truth table) that choosing the bias voltage $V_g=0$ not only clears electrons in the quantum dots $QD_1$ and $QD_2$ but also executes the operation:

C = $A_1$ OR $A_2$

A result C of the operation can be obtained by measuring photons $h\nu'_1$ and $h\nu'_2$ generated by electron-hole recombination by using a photodetector also represented by light detector $L_2$.

A method for fabricating the quantum operational device according to the first embodiment of the invention is explained below with reference to FIGS. 9A to 9D. Assume here that InAs is used as the first and second materials of the well layers $W_1$ and $W_2$, and AlGaSb is used as the third material of the barrier layer B.

Figure 9A:
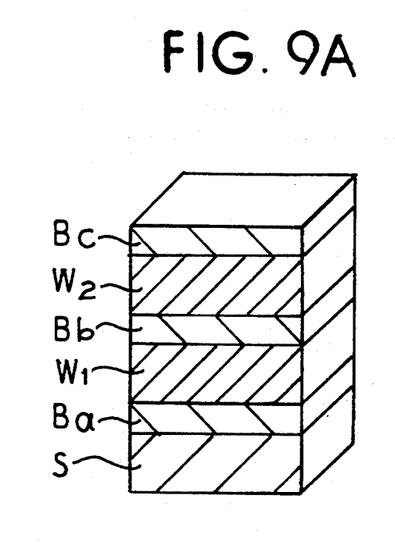
FIGS. 9A, 9B, 9C and 9D are cross-sectional views for explaining a manufacturing process of the quantum operational device according to the first embodiment of the invention.

As shown in FIG. 9A, a barrier layer Ba made of AlGaSb, a well layer $W_1$ made of InAs layer of a thickness $d_1$, a barrier layer Bb made of AlGaSb of a thickness a, a well layer $W_2$ made of InAs layer of a thickness $d_2$, and a barrier layer Bc made of AlGaSb layer are sequentially epitaxially grown on, for example, a GaSb substrate S, by epitaxial growth using an appropriate method such as molecular beam epitaxy (MBE), metal-lorganic chemical vapor deposition (MOCVD) or metallorganic molecular beam epitaxy (MOMBE). The thickness of the barrier layer Ba made of AlGaSb layer is, for example, not less than tens times a nanometer, and the thickness of the barrier layer Bc made of AlGaSb layer is, for example, not less than several nanometers.

Figure 9B:
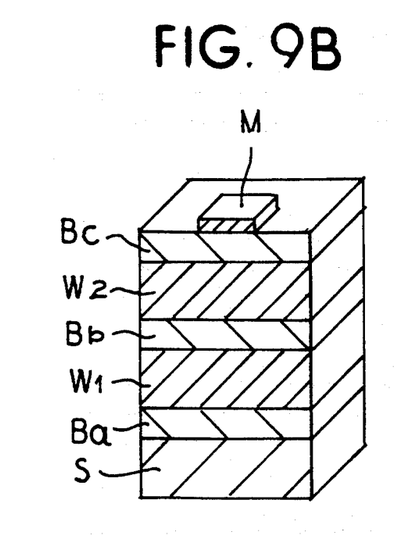

Next, as shown in FIG. 9B, a mask M resistant to dry etching is made on the barrier layer Bc by using, for example, electron beam lithography, scanning tunneling microscopic lithography, or the like. Specifically, the mask M is made of, for example, $SiO_2$ or $Si_3N_4$.

Figure 9C:
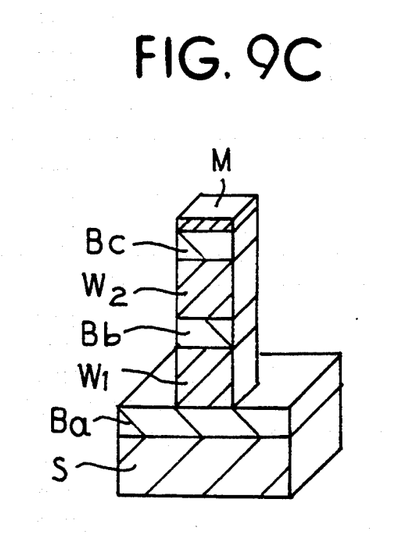

After that, by using the mask M, the barrier layer Bc, well layer $W_2$, barrier layer Bb, well layer $W_1$ and barrier layer Ba are sequentially etched in the vertical direction to the substrate surface by a dry etching method having a strong anisotropy, such as reactive ion etching (RIE) or reactive ion beam etching using electron cyclotron resonance (ECR-RIBE), both using $CH_4+He$, $SiCl_4+He$, or the like as etching gas. The etching is done until just before exposing the GaSb substrate S. As a result, the barrier layer Bc, well layer $W_2$, barrier layer Bb, well layer $W_1$ and barrier layer Ba are etched into a rod-like configuration as shown in FIG. 9C.

Figure 9D:
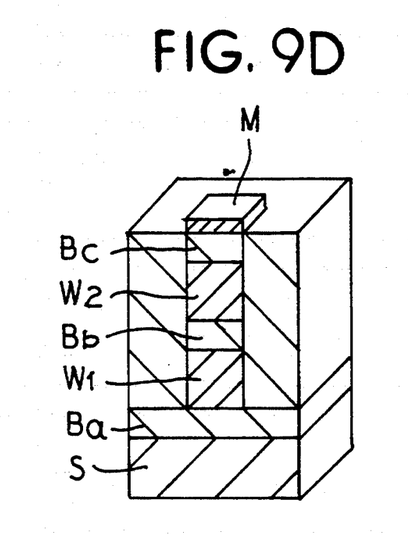

After that, as shown in FIG. 9D, the barrier layer Bd of an AlGaSb layer is epitaxially grown to fill the etched, removed portion. Note that the entirety of the barrier layers Ba, Bb, Bc, Bd and the GaSb substrate S also behaving as a barrier layer corresponds to the barrier layer B of FIGS. 1 and 2.

After that, the mask M is removed, and a resist pattern (not shown) of a shape corresponding to the upper electrode $EL_U$ is formed on the barrier layers Bc and Bd. Subsequently, after a metal film (not shown) of Al or Au is formed on the entire surface by, for example, a vacuum evaporation method, the resist pattern and a part of the metal film located on the resist pattern are removed (lift-off). As a result, the upper electrode $El_U$ is formed as shown in FIGS. 1 and 2. The upper electrode $EL_U$ may also be made by providing a metal film on the barrier layers Bc and Bd and then patterning the metal film by etching.

After that, by making the lower electrode $EL_L$ on the back surface of the GaSb substrate S in substantially the same manner, the quantum operational device is completed.

As described above, the quantum operational device according to the first embodiment can conduct an AND operation, an OR operation and an operation combining an AND operation and an OR operation, and additionally, a NAND operation, a NOR operation and operation combining a NAND operation and a NOR operation, by expressing one-bit information by the presence or absence of one electron in the quantum dot $QD_1$ and the quantum dot $QD_2$ and by using tunnelling of the electron between the quantum dot $QD_1$ and the quantum dot $QD_2$. Since such operation uses tunnelling of one electron, power consumed by the quantum operational device according to the first embodiment is very low. Specifically, energy consumed by the quantum operational device according to the first embodiment is about $k_BT$ (about 24 meV) for operation of one bit, which is in the order of $1/10^4$ of energy consumed by the existing semiconductor memory discussed herein.

A quantum operational device according to a second embodiment of the invention is described below.

Figure 10:
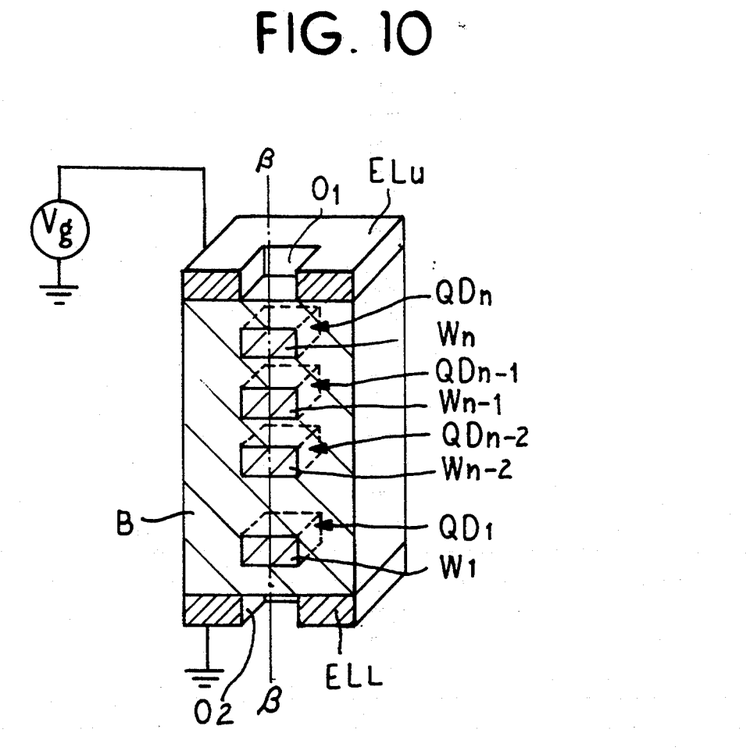
FIG. 10 is a cross-sectional view of a quantum operational device according to a second embodiment of the invention.

FIG. 10 is a cross-sectional view of the quantum operational device according to the second embodiment, which corresponds to FIG. 2.

As shown in FIG. 10, the quantum operational device according to the second embodiment has the same structure as that of the quantum operational device according to the first embodiment except that the second embodiment uses quantum dots arranged in n stages ($n \geq 3$). That is, the quantum operational device according to the second embodiment includes quantum dots $QD_1, \ldots, QD_{n-2}, QD_{n-1}$ and $QD_n$ arranged in n stages. Well layers in the respective quantum dots $QD_1, \ldots, QD_{n-2}, QD_{n-1}$ and $QD_n$ are labelled with $W_1, \ldots, W_{n-2}, W_{n-1}$ and $W_n$.

Figure 11:
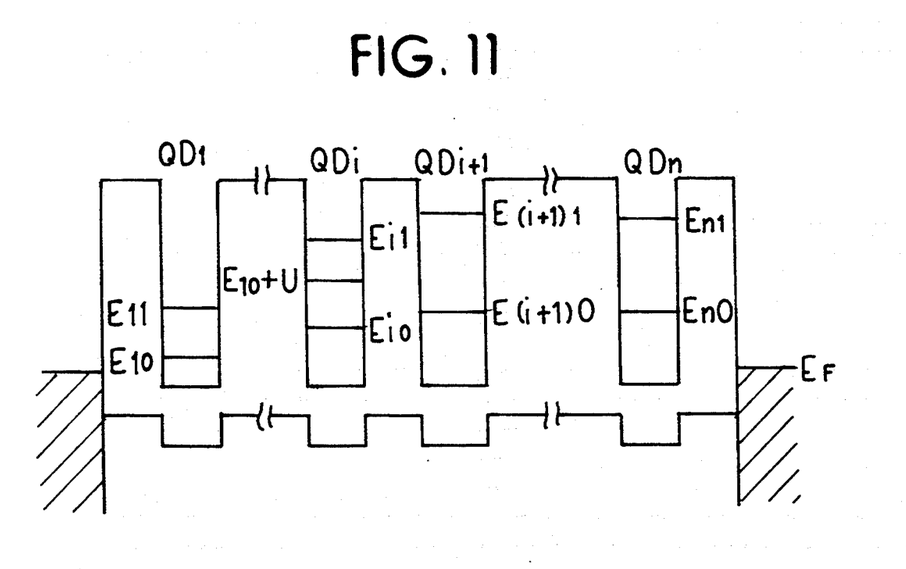
FIG. 11 is an energy band diagram taken along the β—β line of FIG. 10.

FIG. 11 shows an energy band diagram taken along the $\beta$—$\beta$ line of FIG. 10 when the bias voltage $V_g=0$ is being applied to the upper electrode $EL_U$.

The quantum operational device according to the second embodiment satisfies the following conditions (a), (b) and (c).

(a) Condition for confining an electron in a quantum dot $QD_i$ ($i = 1, \ldots, n$):

$$\text{(electron affinity of a material of a well layer } W_k) < \text{(electron affinity of a material of a barrier layer B)} \quad (16)$$

(b) Condition for selective output of bit information in each quantum dot $QD_i$:

$$E_{i1}-E_{i0} \neq E_{j1}-E_{j0} \quad (17)$$

where $E_{in}$ in is an n-th energy level of a quantum dot $QD_i$ in an i-th stage.

(c) Condition for activation at temperature T:

$$E_{i1}-E_{i0} > k_BT, \quad U_i > k_BT \quad (18)$$

where $U_i$ indicates an increase in energy in one-electron state by inter-electron Coulombic interaction in a quantum dot $QD_i$ in an i-th stage which occurs when two electrons enter in the quantum dot $QD_i$.

During a series of input behaviors, for operation and output of the quantum operational device according to the second embodiment, as in the case of the quantum operational device according to the first embodiment, a bias voltage $V_g$ is kept applied to the upper electrode $EL_U$ to satisfy the following equation.

$$E_{i0} < E_{(i+1)0} < E_{i0} + U_i \quad (19)$$

Input to the quantum operational device according to the second embodiment is executed as explained below.

In order to perform an input, while applying the bias voltage $V_g$ to the upper electrode $EL_U$ to satisfy Eq. (19), monochromatic light having a frequency $\nu_n=(E_{n1}-E_{n0})/h$ is irradiated to, for example, the portion of the opening $O_1$ of the upper electrode $EL_U$ to thereby generate an electron-hole pair in the quantum dot $QD_n$. Since the hole in the electron-hole pair is at a next instance absorbed by the upper electrode $EL_U$, the electron is resultantly input into the quantum dot $QD_n$. This process is the same as that of the quantum operational device according to the first embodiment.

Operation of the quantum operational device according to the second embodiment is executed as explained below.

The electron having been input to the quantum dot $QD_n$ in a lowest-potential stage by the input process explained above sequentially propagates to quantum dots $QD_{n-1}$, $QD_{n-2}$ ... in lower stages. If, however, electrons have been input up to the quantum dot $QD_i$ in the i-th stage, then the electron cannot propagate by tunnelling to quantum dots in lower stages beyond the i-th stage due to inter-electron Coulombic interaction, and it is confined in the quantum dot $QD_{i-1}$ in an (i+1)-th stage.

The quantum operational device, when having quantum dots $QD_1$ to $QD_n$ in n stages, can take n electrons at a maximum therein, and enables n occurrences of input of bit information.

Assuming that whether an electron is input (=1) or not (=0) at an i-th occurrence is used as bit information $A_1$, then bit information $B_m$ indicating whether an electron exists (=1) or not (=0) in an m-th quantum dot $QD_m$ from a low-potential side is given by:

$$B_m = \cup (\cap A_k)$$

where operation $\cup$ (union) is done for $i_1$ to $i_m$, and operation $\cap$ (intersection) is done for $k \neq i_1, \ldots, i_m$).

Specifically, when n=4, for example, where the quantum operational device has four quantum dots $QD_1$ to $QD_4$, its truth table appears as shown in Table 3.

TABLE 3

| $A_1$ | $A_2$ | $A_3$ | $A_4$ | $B_1$ | $B_2$ | $B_3$ | $B_4$ |
|---|---|---|---|---|---|---|---|
| 0 | 0 | 0 | 0 | 0 | 0 | 0 | 0 |
| 0 | 0 | 0 | 1 | 1 | 0 | 0 | 0 |
| 0 | 0 | 1 | 0 | 1 | 0 | 0 | 0 |
| 0 | 0 | 1 | 1 | 1 | 1 | 0 | 0 |
| 0 | 1 | 0 | 0 | 1 | 0 | 0 | 0 |
| 0 | 1 | 0 | 1 | 1 | 1 | 0 | 0 |
| 0 | 1 | 1 | 0 | 1 | 1 | 0 | 0 |
| 0 | 1 | 1 | 1 | 1 | 1 | 1 | 0 |
| 1 | 0 | 0 | 0 | 1 | 0 | 0 | 0 |
| 1 | 0 | 0 | 1 | 1 | 1 | 0 | 0 |
| 1 | 0 | 1 | 0 | 1 | 1 | 0 | 0 |
| 1 | 0 | 1 | 1 | 1 | 1 | 1 | 0 |
| 1 | 1 | 0 | 0 | 1 | 1 | 0 | 0 |
| 1 | 1 | 0 | 1 | 1 | 1 | 1 | 0 |
| 1 | 1 | 1 | 0 | 1 | 1 | 1 | 0 |
| 1 | 1 | 1 | 1 | 1 | 1 | 1 | 1 |

It will be understood from Table 3 that the following operations are executed in this case.

$B_1 = A_1$ OR $A_2$ OR $A_3$ OR $A_4$ $B_2 = (A_1$ AND $A_2)$ OR $(A_1$ AND $A_3)$
OR $(A_1$ AND $A_4)$ OR $(A_2$ AND $A_3)$
OR $(A_2$ AND $A_4)$ OR $(A_3$ AND $A_4)$ $B_3 = (A_1$ AND $A_2$ AND $A_3)$ OR $(A_1$ AND $A_2$ AND $A_4)$
OR $(A_1$ AND $A_3$ AND $A_4)$ OR $(A_2$ AND $A_3$ AND $A_4)$ $B_4 = A_1$ AND $A_2$ AND $A_3$ AND $A_4$

Output of the quantum operational device according to the second embodiment is conducted as explained below.

In the quantum operational device according to the second embodiment, bit information in the quantum dot $QD_i$ in the i-th stage can be read out by measuring absorption of monochromatic light with a frequency $\nu_i = (E_{i1} - E_{i0})/h$. Bit information is here again not lost by the measurement, that is, by the reading, and hence the reading of information can be repeated any number of times.

Clearing of the quantum operational device according to the second embodiment can be done, like in the case of the quantum device according to the first embodiment, by choosing the bias voltage $V_g = 0$ applied to the upper electrode $EL_U$.

The quantum operational device according to the second embodiment may be fabricated by the same manufacturing method as that of the first embodiment.

A quantum operational device according to a third embodiment of the invention is explained below.

Figure 12:
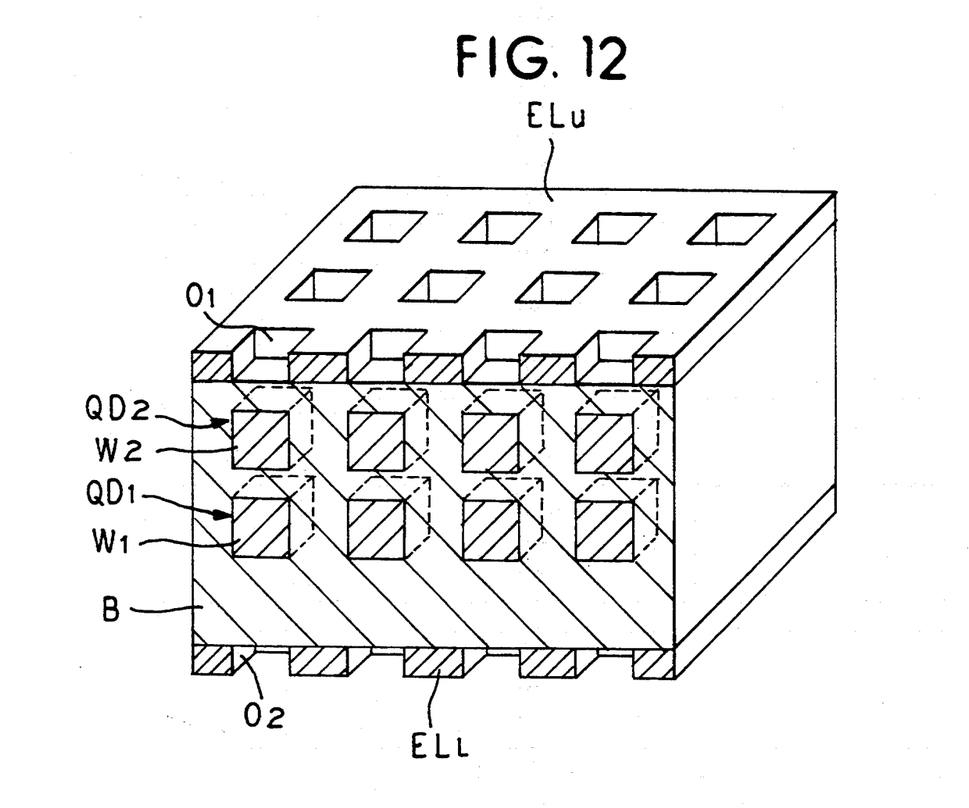
FIG. 12 is a cross-sectional view of a quantum operational device according to a third embodiment of the invention.

FIG. 12 is a cross-sectional view of the quantum operational device according to the third embodiment, which corresponds to FIG. 2 or FIG. 10.

As shown in FIG. 12, the quantum operational device according to the third embodiment has a construction including a plurality of two-dimensional arrays of the two-stage quantum dots $QD_1$ and $QD_2$ according to the first embodiment.

Input, operation, output and clearing of the quantum operational device according to the third embodiment can be done in the same manner as that of the quantum operational device according to the first embodiment. In this case, measurement of photons required upon output may be executed by using a two-dimensional photosensor such as, for example, a CCD (charge coupled device).

The quantum operational device according to the third embodiment, like that according to the first embodiment, is significantly low in power consumption, and additionally high in speed of operation because it performs a number of operations in a parallel concurrent process.

One of the most serious problems with existing digital pattern processing is that it takes much time for such processing. That is, existing digital pattern processing deals with an enormous amount of information of a digital pattern by serially processing its individual pixels one after another, and hence takes a colossal amount of time. This problem, however, can be overcome by performing pattern processing by using the quantum operational device according to the third embodiment. Such a method of pattern processing by the quantum operational device according to the third embodiment is explained below.

Figure 13A:
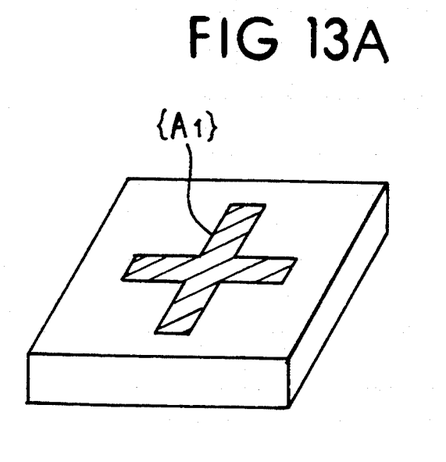
FIGS. 13A and 13B are perspective views for explaining an example in which the quantum operational device according to the third embodiment of the invention is applied to pattern processing.

Under the same conditions used for input in the quantum operational device according to the first embodiment, a pattern $\{A_1\}$ is input in the quantum operational device according to the third embodiment as shown in FIG. 13A. That is, light is irradiated to an area in the form of the pattern $\{A_1\}$ (the area is shown by hatching). In this example, the pattern $\{A_1\}$ has the form of a cross. As a result of the irradiation of light, electrons are input to only those quantum dots $QD_1$ in two-dimensional arrays in the first stage which are located in the area corresponding to the pattern $\{A_1\}$.

Figure 13B:
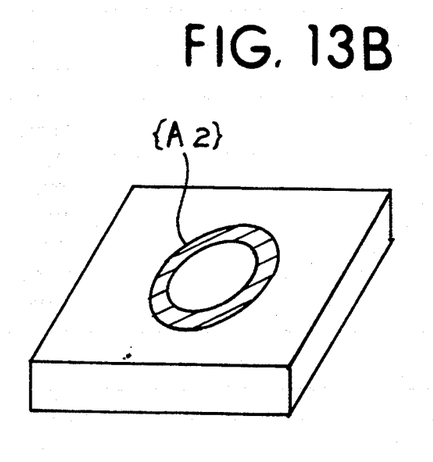

After that, as shown in FIG. 13B, another pattern $\{A_2\}$ is input in the same manner. In this example, the pattern $\{A_2\}$ has the form of a ring. By the second irradiation of light, a state is realized in which electrons have been input to only those of the quantum dots $QD_1$ in two-dimensional arrays in the first stage which are located in an area corresponding to the "sum" of the pattern {A₂} and the pattern {A₁}. This results in a pattern (B₂)={A₁} OR {A₂} having been input to a plurality of quantum dots QD₁ in two-dimensional arrays in the first stage. On the other hand, electrons are input to only those quantum dots QD₂ in two-dimensional arrays in the second stage which are located in areas common to both patterns {A₂} and {A₁}, which correspond to the "product" of the patterns {A₂} and {A₁}. This results in a pattern (B₁)={A₁} AND {A₂} having been input to a plurality of quantum dots QD₂ in two-dimensional arrays in the second stage.

Figure 14A:
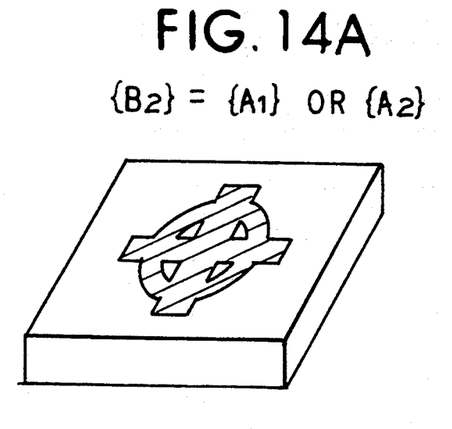
FIGS. 14A and 14B are perspective views for explaining an example in which the quantum operational device according to the third embodiment of the invention is applied to pattern processing.
Figure 14B:
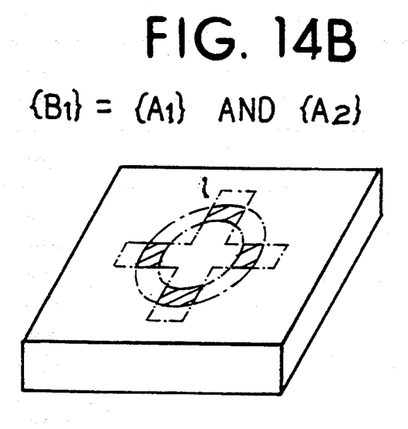

Upon output, the output pattern (B₂)={A₁} OR {A₂} as shown in FIG. 14A is obtained by reading bit information in the quantum dot QD₁ in two dimensional arrays in the first stage (the area where absorption of light occurs is shown by hatching). On the other hand, the output pattern {B₁}={A₁} AND {A₂} is obtained by reading bit information in the quantum dots QD₂ in two dimensional arrays in the second stage.

Input, operation, output, or the like of the patterns can be done at a high speed with low power consumed.

Such a "sum" and a "product" between patterns realized by the above-explained manner are basic operations for pattern processing and indispensable in CAD and computer graphics. Therefore, the quantum operational device according to the third embodiment may be adapted to high-speed processors in CAD and computer graphics systems.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the upper electrodes $EL_U$ and the lower electrodes $EL_L$, although referred to in the first, second and third embodiments as being made of metal, may be made of a transparent electrode material such as, for example, ITO (indium tin oxide) such that light can be input and output through the upper electrode $EL_U$ and the lower electrode $EL_L$ without making the openings $O_1$ and $O_2$ in these electrodes $EL_U$ and $EL_L$ used in the first, second and third embodiments.

The manufacturing method of the quantum operational device explained with reference to the first embodiment is a mere example, and any other appropriate methods may of course be used in lieu of or in combination with the methods referred to herein.

The quantum dots, made of the type-II heterojunction superlattice in the first, second and third embodiments, may otherwise be made of a so-called type-I heterojunction superlattice such as, for example, AlGaAs/GaAs junction.

Moreover, although the first, second and third embodiments input electrons to quantum dots and make them propagate by tunnelling between quantum dots, it may be modified to input holes to quantum dots and make them propagate by tunnelling between quantum dots.

As mentioned above, the invention can realize a quantum operational device whose power consumption is very low and which can be fabricated by a simple manufacturing process.

Further, the invention can realize a quantum operational device which performs operations at a very high speed with a very low power consumption and can be made by a simple manufacturing process.

What is claimed is:

1. A quantum operation memory device, comprising:
   a barrier layer of a first material and having first and second opposite and parallel end faces;
   first and second respective metal electrodes on each of the first and second respective end faces, said metal electrodes each having means for permitting light to pass through the electrode at an end face where the light originates and into the barrier layer and along a longitudinal path therein running between the first and second end faces;
   a controllable light source for emitting said light at a first frequency or at second and third frequencies into said barrier layer and along said longitudinal path;
   first and second quantum boxes each formed of a box-shaped region of materials which are different than said first material, said first and second quantum boxes being positioned along and on said longitudinal path in series one after the other, said quantum boxes being dimensioned so that each quantum box can accommodate only one electron or hole and such that inter-electron or inter-hole Coulombic interaction prevents an electron or hole in one of the boxes from tunnelling to the other box if that other box already has an electron or hole therein, and a spacing between the boxes being chosen to allow tunnelling of an electron or hole between the boxes;
   a bias voltage for application between the first and second electrodes for creation of an electron or hole in one of the quantum boxes when the light of said first frequency is emitted into said barrier layer, and for permitting an electron or hole to tunnel from one of the quantum boxes to the other quantum box when an electron or hole does not exist in the other quantum box; and
   means for measuring absorption of said light at said second frequency to determine whether or not an electron or hole exists in the second quantum box, and for measuring absorption of said light at said third frequency to determine whether or not an electron or hole exists in the first quantum box, said electron or hole in the quantum boxes functioning as memory bits whose presence or absence determines a memory state of the respective quantum box.

2. A device according to claim 1 wherein more than two quantum boxes are arranged in series in said barrier layer along said longitudinal path.

3. A device according to claim 1 wherein the quantum boxes comprise a type-II heterojunction super lattice.

4. A device according to claim 1 wherein the material of the first and second quantum boxes is the same, but different than the first material of the barrier layer.

5. A device according to claim 1 wherein the materials of the first and second quantum boxes are different, said different materials both being different than said first material of said barrier layer.

6. A device according to claim 1 wherein the means for permitting light to pass comprises a light opening in each of said first and second metal electrodes.

7. A quantum operation memory device, comprising:
   a barrier layer of a first material and having first and second opposite and parallel end faces;

first and second respective electrodes on each of the first and second respective end faces, said electrodes each permitting light to pass through the electrode at an end face where the light originates and into the barrier layer and along a longitudinal path therein running between the first and second end faces;

a controllable light source for emitting said light at a first frequency or at second and third frequencies into said barrier layer and along said longitudinal path;

first and second quantum boxes each formed of a box-shaped region of materials which are different than said first material, said first and second quantum boxes being positioned along and on said longitudinal path in series one after the other, said quantum boxes being dimensioned and the materials forming the boxes being selected such that each quantum box can accommodate an electron or hole and such that inter-electron or inter-hole Coulombic interaction prevents an electron or hole in one of the boxes from tunnelling to the other box if that other box has an electron or hole therein, and a spacing between the boxes being chosen to allow tunnelling of an electron or hole between the boxes;

a bias voltage for application between the first and second electrodes for creation of an electron or hole in one of the quantum boxes when the light of said first frequency is emitted into said barrier layer, and for permitting an electron or hole to tunnel from one of the quantum boxes to the other quantum box when an electron or hole does not exist in the other quantum box; and means for measuring absorption of said light at said second frequency to determine whether or not an electron or hole exists in the second quantum box, and for measuring absorption of said light at said third frequency to determine whether or not an electron or hole exists in the first quantum box, said electron or hole in the quantum boxes functioning as memory bits whose presence or absence determines a memory state of the respective quantum box.

8. A device according to claim 7 wherein more than two quantum boxes are arranged in series in said barrier layer along said longitudinal path.

9. A device according to claim 7 wherein the quantum boxes comprise a type-II heterojunction super lattice.

10. A device according to claim 7 wherein the material of the first and second quantum boxes is the same, but different than the first material of the barrier layer.

11. A quantum operation memory device, comprising:

a barrier layer of a first material and having first and second opposite and parallel end faces;

first and second respective electrodes on each of the first and second respective end faces, said electrodes each having means for permitting light to pass through the electrode in an end face where the light originates and into the barrier layer and along a longitudinal path therein running between the first and second end faces;

a controllable light source for emitting said light at a first frequency into said barrier layer and along said longitudinal path;

first and second quantum boxes each formed of a box-shaped region of materials which are different than said first material, said first and second quantum boxes being positioned along said longitudinal path in series one after the other, said quantum boxes being dimensioned and the materials forming the boxes being selected such that each quantum box can accommodate an electron or hole and such that inter-electron or inter-hole Coulombic interaction prevents an electron or hole in one of the boxes from tunnelling to the other box if the other box has an electron or hole therein, and a spacing between the boxes being chosen to allow tunnelling of an electron or hole between the boxes;

a bias voltage for application between the first and second electrodes for creation of an electron or hole in one of the quantum boxes when the light of said first frequency is emitted into said barrier layer, and for permitting an electron or hole to tunnel from one of the quantum boxes to the other quantum box when an electron or hole does not exist in the other quantum box; and a photodetector for measuring photons generated by electron-hole recombination to determine the result of an operation where an electron or hole is injected into at least one of the quantum boxes.

12. A method for storing information, comprising the steps of:

providing a barrier layer having first and second opposite end faces which are parallel and wherein each of the end faces has a respective first and second electrode thereon, said electrodes permitting a light beam to pass through and into said barrier layer and along a longitudinal light path through the barrier layer between the two electrodes;

providing in said barrier layer a first quantum box and a second quantum box both positioned in series along and on the longitudinal path within the barrier layer and spaced apart by a distance permitting electron tunnelling between the two quantum boxes, presence or absence of an electron or a hole in the quantum boxes being used as bit information for memory storage, and said quantum boxes being dimensioned and a material thereof being selected such that only one electron or one hole can exist in each box and such that tunnelling of an electron or hole from one of the quantum boxes to the other quantum box is prohibited by inter-electron or inter-hole Coulombic interaction when an electron or hole exists in the other quantum box;

inputting an electron or hole serving as storage bit information to one of said quantum boxes by applying a bias voltage between the first and second electrodes and irradiating light of a first frequency into said barrier layer along said longitudinal path; and for outputting bit information, irradiating light of a second frequency into said barrier layer and along said path, and measuring absorption of said light to determine presence or absence of an electron or hole in one of the quantum boxes, and irradiating light of a third frequency into said barrier layer and along said path, and measuring absorption of said light to determine presence or absence of an electron or hole in the other of the quantum boxes.

13. A method according to claim 12 including the step of erasing a memory bit by changing said bias voltage.

14. A method according to claim 13 wherein said bias voltage is removed.

15. A method according to claim 12 including the step of erasing a memory bit by applying a bias voltage opposite in polarity from said bias voltage which is applied.

16. A method for storing information, comprising the steps of:
providing a barrier layer having first and second opposite end faces which are parallel and wherein each of the end faces has a respective first and second electrode thereon, said electrodes permitting a light beam to pass through and into said barrier layer and along a longitudinal light path through the barrier layer between the two electrodes;
providing in said barrier layer a first quantum box and a second quantum box both positioned in series along and on the longitudinal path within the barrier layer and spaced apart by a distance permitting electron tunnelling between the two quantum boxes, presence or absence of an electron or a hole in the quantum boxes being used as bit information for memory storage, and said quantum boxes being dimensioned and a material thereof being selected such that tunnelling of an electron or hole from one of the quantum boxes to the other quantum box is prohibited by inter-electron or inter-hole Coulombic interaction when an electron or hole exists in the other quantum box;
inputting an electron or hole serving as storage bit information to one of said quantum boxes by applying a bias voltage between the first and second electrodes and irradiating light of a first frequency into said barrier layer along said longitudinal path; and
for determining a result of an operation, employing a photodetector to measure photons generated by electron-hole recombination occurring when an electron or hole is injected into at least one of the quantum boxes.

17. A method for storing information, comprising the steps of:
providing a barrier layer having first and second opposite end faces which are parallel and wherein each of the end faces has a respective first and second electrode thereon, said electrodes permitting a light beam to pass through and into said barrier layer and along a longitudinal light path through the barrier layer between the two electrodes;
providing in said barrier layer a first quantum box and a second quantum box both positioned in series along and on the longitudinal path within the barrier layer and spaced apart by a distance permitting electron tunnelling between the two quantum boxes, presence or absence of an electron or a hole in the quantum boxes being used as bit information for memory storage, and said quantum boxes being dimensioned and a material thereof being selected such that tunnelling of an electron or hole from one of the quantum boxes to the other quantum box is prohibited by inter-electron or inter-hole Coulombic interaction when an electron or hole exists in the other quantum box;
inputting an electron or hole into said second quantum box by irradiating light having a wavelength resonant with electron-hole pair generation energy of said second quantum box and thereby generating an electron-hole pair while applying a bias voltage across said electrodes so that potential increases from said second quantum box toward said first quantum box; and
in an output mode, measuring absorption of light by irradiating light having a wavelength resonant with a difference in energy between sub-bands of said first quantum box, and measuring absorption of light by irradiating light having a wavelength resonant with a difference in energy between sub-bands of said second quantum box.

18. A method for storing information, comprising the steps of:
providing a barrier layer having first and second opposite end faces which are parallel and wherein each of the end faces has a respective first and second electrode thereon, said electrodes permitting a light beam to pass through and into said barrier layer and along a longitudinal light path through the barrier layer between the two electrodes;
providing in said barrier layer a first quantum box and a second quantum box both positioned in series along and on the longitudinal path within the barrier layer and spaced apart by a distance permitting electron tunnelling between the two quantum boxes, presence or absence of an electron or a hole in the quantum boxes being used as bit information for memory storage, and said quantum boxes being dimensioned and a material thereof being selected such that tunnelling of an electron or hole from one of the quantum boxes to the other quantum box is prohibited by inter-electron or inter-hole Coulombic interaction when an electron or hole exists in the other quantum box;
inputting an electron or hole into said second quantum box by irradiating light having a wavelength resonant with electron-hole pair generation energy of said second quantum box and thereby generating an electron-hole pair while applying a bias voltage across said electrodes so that potential increases from said second quantum box toward said first quantum box; and
in an erasing and output mode, changing said bias voltage and measuring emission of light generated by recombining of an electron with a hole in at least one of the first or second quantum boxes, said electron or hole being thereby erased from said at least one quantum box.

19. A method for storing information, comprising the steps of:
providing a barrier layer having first and second opposite end faces which are parallel and wherein each of the end faces has a respective first and second electrode thereon, said electrodes permitting a light beam to pass through and into said barrier layer and along a longitudinal light path through the barrier layer between the two electrodes;
providing in said barrier layer a first quantum box and a second quantum box both positioned in series along and on the longitudinal path within the barrier layer spaced apart by a distance permitting electron tunnelling between the two quantum boxes, presence or absence of an electron or a hole in the quantum boxes being used as bit information for memory storage, and said quantum boxes being dimensioned and a material thereof being selected such that tunnelling of an electron or hole from one of the quantum boxes to the other quantum box is prohibited by inter-electron or inter-hole Coulombic interaction when an electron or hole exists in the other quantum box;

applying a bias voltage across the first and second electrodes, irradiating a light of a first frequency through said first electrode and along said longitudinal path so that an electron-hole pair is selectively generated only in the second quantum box, the hole of the electron-hole pair being absorbed by the first electrode adjacent said second quantum box, the electron of the electron-hole pair being left alone in the second quantum box, and wherein at the same time the electron in the second quantum box propagates through the barrier layer between the second and first quantum boxes by tunnelling; and again irradiating said light of said first frequency through said first electrode and along said longitudinal path so that an electron is input into the second quantum box to provide a second bit information, a first bit information being represented by the electron tunnelled into the first quantum box.

20. A method according to claim 19 including the step of outputting bit information by applying a bias voltage between the first and second electrodes and irradiating the barrier layer with a light having a second frequency and measuring absorption of said second frequency light at said second quantum box to determine presence or absence of an electron or hole in said second quantum box, and irradiating the barrier layer with a light having a third frequency and measuring absorption of said third frequency light at said first quantum box to determine presence or absence of an electron or hole in said first quantum box.

21. A method for operating a quantum operation device, comprising the steps of:

providing a barrier layer of a first material and having first and second opposite and parallel end faces;

providing first and second respective metal electrodes on each of the first and second respective end faces, said metal electrodes permitting light to pass through and into first and second quantum boxes on a longitudinal path running between the first and second end faces;

forming the first and second quantum boxes as respective box-shaped regions of materials which are different than said first material, said first and second quantum boxes being positioned along and on said longitudinal path in series one after the other, said quantum boxes being dimensioned so that a Coulomb interaction between electrons or holes in the quantum boxes prevents an electron or hole from tunnelling from one quantum box to the other if the other quantum box is already filled with an electron or hole, and a spacing between the boxes being chosen to allow tunnelling of an electron or hole between the boxes;

providing a controllable light source for emitting said light at a first frequency which resonates with a band gap of said first quantum box or at a second frequency which resonates with a band gap of said second quantum box;

applying a bias voltage between the first and second electrodes for permitting an electron or hole to tunnel from a quantum box at a higher potential to a quantum box at a lower potential when an electron or hole does not exist in the quantum box at the lower potential, said bias voltage prohibiting an electron or hole from tunnelling from the quantum box at the higher potential to the quantum box at the lower potential due to Coulomb repulsion between electrons or holes when electrons or holes exist in the quantum box at the lower potential;

irradiating said light at said first frequency given said bias voltage to input an electron or hole into said first quantum box by exciting an electron in a valence band, said electron or hole in the quantum boxes functioning as information bits whose presence or absence determines information stored in the quantum box;

irradiating said light at said second frequency given said bias voltage to input an electron or hole into said second quantum box by exciting an electron in a valence band, said electron or hole in the quantum boxes functioning as information bits whose presence or absence determines information stored in the quantum box; and measuring photons generated by electron-hole recombination to determine a result of an operation where an electron or hole is injected into the quantum boxes.

22. A method according to claim 21 including the step of providing a photodetector for measuring photons generated by electron-hole recombination to determine the result of an operation where an electron or hole is injected into the quantum boxes.

* * * * *